(12) United States Patent
Kato

(10) Patent No.: US 12,555,751 B2
(45) Date of Patent: Feb. 17, 2026

(54) PLASMA PROCESSING APPARATUS AND SEMICONDUCTOR DEVICE MANUFACTURING METHOD

(71) Applicant: Tokyo Electron Limited, Tokyo (JP)

(72) Inventor: Takaaki Kato, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 531 days.

(21) Appl. No.: 18/044,648

(22) PCT Filed: Sep. 6, 2021

(86) PCT No.: PCT/JP2021/032607
§ 371 (c)(1),
(2) Date: Mar. 9, 2023

(87) PCT Pub. No.: WO2022/059537
PCT Pub. Date: Mar. 24, 2022

(65) Prior Publication Data
US 2023/0335380 A1    Oct. 19, 2023

(30) Foreign Application Priority Data
Sep. 15, 2020  (JP) ................. 2020-154861

(51) Int. Cl.
*H01J 37/32*  (2006.01)
(52) U.S. Cl.
CPC .. *H01J 37/32568* (2013.01); *H01J 37/32082* (2013.01); *H01J 37/3244* (2013.01);
(Continued)

(58) Field of Classification Search
USPC .................................... 156/345.34
See application file for complete search history.

(56) References Cited

U.S. PATENT DOCUMENTS

| | | | | |
|---|---|---|---|---|
| 11,139,147 | B1* | 10/2021 | Iwao | H01J 37/32082 |
| 2020/0168441 | A1* | 5/2020 | Tateshita | H01J 37/32522 |
| 2022/0068603 | A1* | 3/2022 | Ikeda | H01L 21/683 |

FOREIGN PATENT DOCUMENTS

| | | |
|---|---|---|
| JP | 2009-004796 A | 1/2009 |
| JP | 2020-088193 A | 6/2020 |

(Continued)

*Primary Examiner* — Ram N Kackar
(74) *Attorney, Agent, or Firm* — Armstrong Teasdale LLP

(57) ABSTRACT

A plasma processing apparatus generating plasma by electromagnetic waves supplied into a processing container to process a substrate, includes an upper electrode disposed in an upper portion of the processing container, a power supply member connected to the upper electrode to supply electromagnetic waves to the upper electrode, a first shield member and a second shield member configured to electrically shield the upper electrode and the power supply member, a ring-shaped insulating member provided between the upper electrode and the first shield member and between the upper electrode and the second shield member, and having a plurality of gas through-holes penetrating inside thereof, and a conductive member covering a first end of the insulating member and electrically interconnecting the first shield member and the second shield member. The power supply member passes through an inner space in the insulating member and supplies electromagnetic waves to the upper electrode.

16 Claims, 4 Drawing Sheets

(52) U.S. Cl.
CPC ... *H01J 37/32577* (2013.01); *H01J 2237/026* (2013.01); *H01J 2237/038* (2013.01); *H01J 2237/332* (2013.01)

(56) References Cited

FOREIGN PATENT DOCUMENTS

| | | |
|---|---|---|
| JP | 2020-092034 A | 6/2020 |
| JP | 2020-092177 A | 6/2020 |

* cited by examiner

A-A cross section

B-B cross section

PLASMA PROCESSING APPARATUS AND SEMICONDUCTOR DEVICE MANUFACTURING METHOD

CROSS-REFERENCE TO RELATED APPLICATIONS

The present application is a U.S. National Stage Entry of International Patent Application No. PCT/JP2021/032607, filed Sep. 6, 2021, which claims the benefit of priority to Japanese Patent Application No. 2020-154861, filed Sep. 15, 2020, each of which is hereby incorporated herein by reference in its entirety.

TECHNICAL FIELD

The present disclosure relates to a plasma processing apparatus and a semiconductor device manufacturing method.

BACKGROUND

For example, in Patent Document 1, a disk-shaped overhead electrode is provided over a wafer in a processing container and supported with a predetermined gap length. A gas line is connected to a gas inlet connected to the center of the overhead electrode and introduces gas into the overhead electrode through the gas inlet. The gas is supplied into a processing space in the form of shower through a gas path and a number of gas holes formed in the overhead electrode. Patent Documents 2, 3, and 4 all describe plasma processing apparatuses.

PRIOR ART DOCUMENTS

Patent Documents

Patent Document 1: Japanese Laid-Open Publication No. 2009-4796
Patent Document 2: Japanese Laid-Open Publication No. 2020-88193
Patent Document 3: Japanese Laid-Open Publication No. 2020-92034
Patent Document 4: Japanese Laid-Open Publication No. 2020-92177

The present disclosure provides a technique capable of achieving in-plane uniformity of plasma.

SUMMARY

According to an aspect of the present disclosure, a plasma processing apparatus, which generates plasma by electromagnetic waves supplied into a processing container to perform processing of a substrate, includes: an upper electrode disposed in an upper portion of the processing container; a power supply member which is connected to the upper electrode to supply electromagnetic waves to the upper electrode; a first shield member configured to electrically shield the upper electrode and the power supply member; a second shield member configured to electrically shield the upper electrode and the power supply member; a ring-shaped insulating member provided between the upper electrode and the first shield member and between the upper electrode and the second shield member, and having a plurality of gas through-holes penetrating an inside of the ring-shaped insulating member; and a conductive member covering a first end portion of the insulating member and electrically interconnecting the first shield member to the second shield member, wherein the power supply member passes through an inner space in the insulating member and supplies the electromagnetic waves to the upper electrode.

According to an aspect, it is possible to achieve in-plane uniformity of plasma.

DETAILED DESCRIPTION

Figure 1:
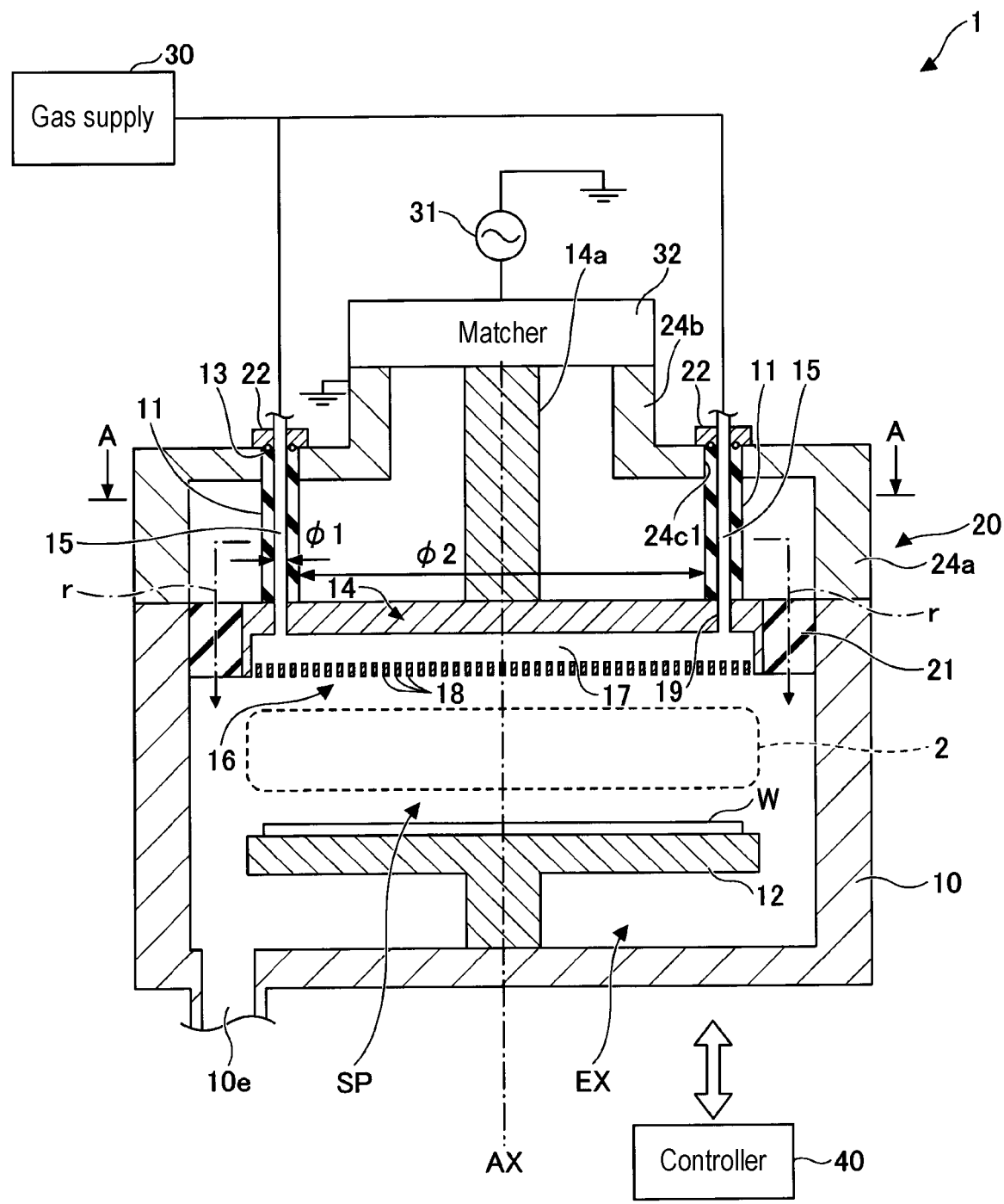
FIG. 1 is a cross-sectional schematic view illustrating an example of a plasma processing apparatus according to a first embodiment.

Hereinafter, embodiments of the present disclosure will be described with reference to the accompanying drawings. In each of the drawings, the same components may be denoted by the same reference numerals, and redundant descriptions thereof may be omitted.

First Embodiment

[Plasma Processing Apparatus]

Figure 2:
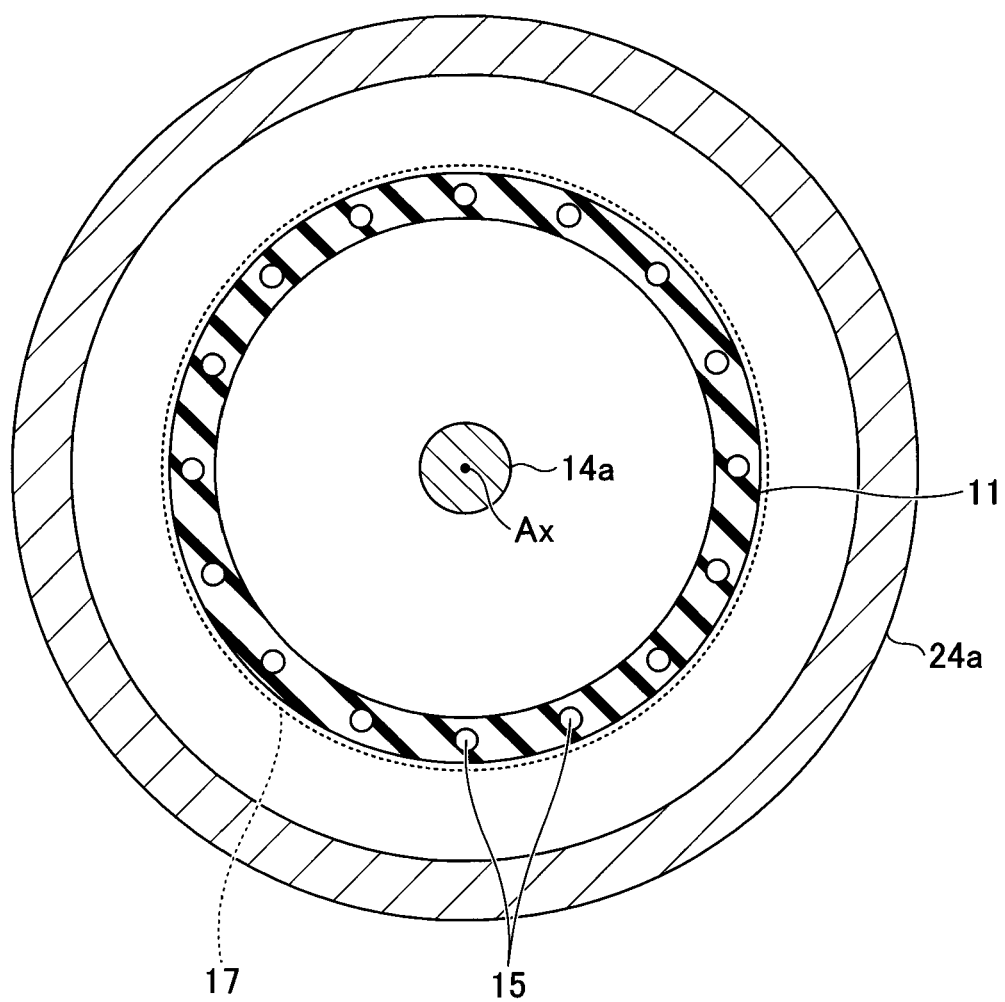
FIG. 2 is a view illustrating A-A cross section of FIG. 1.

First, a plasma processing apparatus 1 according to a first embodiment will be described with reference to FIGS. 1 and 2. FIG. 1 is a cross-sectional schematic view illustrating an example of a plasma processing apparatus according to the first embodiment. FIG. 2 is a view illustrating A-A cross section of FIG. 1.

The plasma processing apparatus 1 according to the first embodiment includes a processing container 10, an insulating member 11, a stage 12, an upper electrode 14, a power supply member 14a, a first shield member 24a, a second shield member 24b, a power supply 31, a matcher 32, and a controller 40.

The processing container 10 has a cylindrical shape and extends in a vertical direction. The central axis of the processing container 10 is an axis AX extending in the vertical direction. The processing container 10 is made of a conductive metal such as an aluminum-containing metal. The processing container 10 is grounded. A carry-in/out port (not illustrated) for a substrate W, exemplified by a wafer, is formed in the side wall of the processing container 10, and the substrate W is transported through the carry-in/out port by opening/closing a gate valve.

The stage 12 is provided in the processing container 10, and the substrate W is placed thereon. An exhaust port 10e is formed in the bottom of the processing container 10 below the stage 12. The interior of the processing container 10 is evacuated through an exhaust space Ex by an exhaust apparatus connected to the exhaust port 10e.

Above the stage 12, an upper electrode 14 is disposed in the upper portion of the processing container 10 via a plasma processing space (hereinafter, referred to as a "space SP") in the processing container 10. The upper electrode 14 is substantially disk-shaped and arranged to face the stage 12.

A power supply member 14a is connected to the top surface of the upper electrode 14 at the center. The upper electrode 14 and the power supply member 14a are made of metal. The power supply member 14a is rod-shaped, for example, and shares the axis AX with the upper electrode 14 and the processing container 10.

Sharing the axis AX means that objects are arranged such that the axes AX become identical as the central axes of the objects, and that objects are arranged such that the axes AX become generally or substantially identical as the central axes of the objects.

A ring-shaped dielectric window 21 is fitted between the side surface of the upper electrode 14 and the side surface of the processing container 10. The dielectric window 21 is made of, for example, alumina, but is not limited thereto, and may be made of a low-loss dielectric material. The dielectric window 21 shares the axis AX with the processing container 10. The dielectric window 21 electrically insulates the upper electrode 14 and transmits electromagnetic waves to serve as a transmission path for radiating an electromagnetic field into the processing container 10.

Above the upper electrode 14, a first shield member 24a configured to electrically shield the upper electrode 14 and the power supply member 14a, and a second shield member 24b configured to electrically shield the upper electrode 14 and the power supply member 14a are provided. The first shield member 24a and the second shield member 24b are made of metal and grounded. The first shield member 24a is an annular member having an inverted L-shaped cross section that extends vertically from the upper portion of the side wall of the processing chamber 10 and extends inward from its upper portion. One end of the first shield member 24a is in contact with the upper portion of the side wall of the processing container 10, and the other end is in contact with the outer surface of the insulating member 11 along the entire circumference thereof. The second shield member 24b is a cylindrical member having an inner diameter smaller than the inner diameter of the processing container 10 and larger than the diameter of the power supply member 14a, and protrudes outward over the entire circumference at the outer end thereof such that it has an L-shaped cross section. One end of the second shield member 24b is in contact with the bottom surface of the matcher 32, and the other end is in contact with the inner surface of the insulating member 11 along the entire circumference thereof.

The second shield member 24b supports the matcher 32. The power supply member 14a is electrically connected to the power supply 31 via the matcher 32. The power supply 31 is a plasma source that generates electromagnetic waves in the VHF band. The power supply 31 may be a plasma source that generates electromagnetic waves in the UHF band. For example, in this embodiment, the frequency of the electromagnetic waves output from the power supply 31 is preferably 100 MHz or more and 800 MHz or less. The matcher 32 includes a matching circuit configured to match the load-side impedance seen from the power supply 31 with the output impedance of the power supply 31.

The power supply member 14a and the upper electrode 14 function as internal conductors for propagating electromagnetic waves in the VHF band. The electromagnetic waves pass through the matcher 32 and flow from the power supply member 14a to the outer peripheral side through the center of the upper electrode 14. The electromagnetic waves pass through the dielectric window 21 and radiate an electromagnetic field inside the processing container 10.

The first shield member 24a and the second shield member 24b form an electromagnetic wave return circuit and function as external conductors for propagating the electromagnetic waves. Some of the electromagnetic field energy of the electromagnetic waves radiated into the processing container 10 are consumed in the generation of plasma 2 in the space SP. The remaining electromagnetic waves propagate through the sidewall of the processing container 10, the first shield member 24a, and the second shield member 24b, return to the matcher 32 side, and cause a current to flow through the ground planes of the first shield member 24a and the second shield member 24b.

In other words, a coaxial waveguide 20 is formed by the power supply member 14a, the upper electrode 14, the first shield member 24a, and the second shield member 24b, and a waveguide path r of the electromagnetic waves is formed inside the coaxial waveguide 20. In this embodiment, the waveguide forming the waveguide path r is a coaxial waveguide but is not limited thereto. A rectangular waveguide may be formed instead of the coaxial waveguide 20.

The dielectric window 21 has a function of transmitting electromagnetic waves to serve as a transmission path for electromagnetic waves, and a function of partitioning the atmospheric space in the coaxial waveguide 20 from a reduced-pressure space in the processing container 10 to seal the space SP. As a result, airtightness in the processing container 10 is maintained.

Below the upper electrode 14, a shower head 16 is provided in parallel with the upper electrode 14. A ring-shaped gas supply port 19 penetrating the upper electrode 14 and communicating with the diffusion chamber 17 is formed in the upper electrode 14. The shower head 16 includes the diffusion chamber 17 configured to diffuse gas therein, and a plurality of gas ejection holes 18. The diffusion chamber 17 and the plurality of gas ejection holes 18 are examples of a gas path formed in the shower head 16.

In general, electromagnetic waves having a frequency of 100 MHz or higher tend to propagate through different paths compared to radio-frequency waves having a frequency lower than that. When electromagnetic waves of 100 MHz or higher are applied to the upper electrode 14 through the power supply member 14a, surface wave plasma is generated on the bottom surface of the shower head 16 by the electromagnetic waves.

For example, it is considered that when plasma is generated by electromagnetic waves in the VHF band of 220 MHz, the plasma 2 is generated by the energy of the electromagnetic field of the electromagnetic waves radiated from the space between the inner conductor and the outer conductor (hereinafter, referred to as "radiated electromagnetic waves"). On the other hand, when radio-frequency waves of, for example, 60 MHz or lower are applied to the upper electrode 14 via the power supply member 14a, an electric discharge phenomenon occurs between the upper electrode 14 and the stage 12 based on Paschen's law, and the plasma 2 is generated by capacitive coupling in the space SP. However, it is difficult to clearly distinguish between the frequency at which capacitively coupled plasma is generated and the frequency at which electromagnetic surface wave plasma is generated. In other words, it is considered that a frequency at which the energy for plasma generation by "capacitive coupling" and the energy for plasma generation by "radiated electromagnetic waves" are approximately equal is present.

When electromagnetic waves in the VHF band or the UHF band are used as a plasma source, standing waves are formed in the processing container 10 by the surface waves of the electromagnetic waves, and the standing waves are one of the factors that reduce the in-plane uniformity of the plasma. Higher-order modes among propagation modes when electromagnetic waves are radiated from the coaxial waveguide 20 into the processing container 10 are one of the factors that reduce the in-plane uniformity of plasma.

In order to achieve in-plane uniformity of plasma, it is important that the structure around the upper electrode 14 has a concentric ring shape and is rotationally symmetrical about the axis Ax. This makes it difficult for a higher-order mode of the propagation modes of electromagnetic waves to occur and reduces the bias of the electromagnetic waves supplied to the space SP, which can facilitate in-plane uniformity of plasma.

For this reason, in this embodiment, the structure around the upper electrode 14 is formed in a concentric ring shape centering on the axis Ax. For example, the upper electrode 14, the power supply member 14a, the first shield member 24a, the second shield member 24b, the dielectric window 21, the shower head 16, and the insulating member 11 are all concentrically arranged around the axis Ax.

In this embodiment, the ring-shaped insulating member 11 is provided between the upper electrode 14 and the first shield member 24a and between the upper electrode 14 and the second shield member 24b. The insulating member 11 is fitted in a ring-shaped gap 24c1 formed between the first shield member 24a and the second shield member 24b. As a result, the first end portion (e.g., the upper end portion) of the insulating member 11 is in direct contact with both the first shield member 24a and the second shield member 24b, and the second end portion (e.g., the lower end portion) of the insulating member 11 is in direct contact with the upper electrode 14. A plurality of gas through-holes 15 penetrate through the interior of the insulating member 11.

The power supply member 14a is configured to supply electromagnetic waves to the upper electrode 14 through the inner space of the insulating member 11. The insulating member 11 is formed in a ring shape, wherein the upper end of the insulating member 11 passes through the ring-shaped gap 24c1 formed between the first shield member 24a and the second shield member 24b, and the lower end of the insulating member 11 is connected to the top surface of the upper electrode 14. With such a configuration, a path configured to allow gas to pass through the space of the coaxial waveguide 20 through which electromagnetic waves pass is provided in the insulating member 11. The power supply member 14a and the insulating member 11 are configured to share the central axis Ax, which can facilitate in-plane uniformity of plasma.

The insulating member 11 is made of, for example, alumina and may transmit electromagnetic waves. The interiors of the gas through-holes 15 penetrating through the insulating member 11 communicate with the processing container 10 via the shower head 16 to form reduced-pressure spaces. Therefore, in the pressure-reduced spaces in the gas through-holes 15, the gas flowing through the gas through-holes 15 is in a situation of being easily discharged by the energy of the electromagnetic waves that pass through the insulating member 11. Therefore, in order to avoid electric discharge inside the gas through-holes 15, a diameter $\varphi 1$ of the gas through-holes 15 is preferably 6 mm or less.

An inner diameter $\varphi 2$ of the ring-shaped insulating member 11 is preferably 150 mm or more. Including these conditions, the interiors of the gas through-holes 15 are designed not to exceed an electric discharge initiation voltage.

With such design, by setting the diameter $\varphi 1$ of the gas through-holes 15 to 6 mm or less, it is possible to suppress the occurrence of electric discharge. In addition, by setting the inner diameter $\varphi 2$ of the ring-shaped insulating member 11 to 150 mm or more, it is possible to achieve in-plane uniformity of plasma. The reason for this is that, in the space within the coaxial waveguide 20, the electric field tends to be relatively weak on the outer peripheral side and stronger on the inner peripheral side than on the outer peripheral side. Therefore, by setting the inner diameter $\varphi 2$ of the ring-shaped insulating member 11 to 150 mm or more and not disposing the insulating member 11 on the inner peripheral side of the coaxial waveguide 20 near the power supply member 14a, it is possible to further reduce the occurrence of electric discharge inside the gas through-holes 15.

Referring to FIG. 2 illustrating A-A cross section of FIG. 1 together with FIG. 1, the section and the like of the insulating member 11 formed in a ring shape are illustrated. The plurality of gas through-holes 15 are provided rotationally symmetrical with respect to the axis Ax serving as the central axis. In this embodiment, the number of gas through-holes 15 is 16, but the number is not limited thereto. The number of gas through-holes 15 may be 8 to 16 or may be a different number. It is preferable to evenly arrange the plurality of gas through-holes 15 in the circumferential direction.

By forming the insulating member 11 to be concentrically ring-shaped around the axis Ax as the central axis and arranging the plurality of gas through-holes 15 to be rotationally symmetrical with respect to the axis Ax, it is possible to suppress the electric discharge of the gas through-holes 15 and to improve the in-plane uniformity of plasma.

In this embodiment, the plurality of gas through-holes 15 communicate with the shower head 16 below the upper electrode 14 to supply the diffusion chamber 17 with gas. The gas is supplied to the space SP from the plurality of gas ejection holes 18. However, the shower head 16 may not be provided. In the absence of the shower head 16, the gas is supplied to the space SP from a plurality of gas supply ports 19 formed in the upper electrode 14 communicating with the plurality of gas through-holes 15.

At the upper end of the insulating member 11 exposed from the gap 24c1 between the first shield member 24a and the second shield member 24b, a ring-shaped conductive member 22 having a width wider than the radial width of the insulating member 11 is provided. The conductive member 22 is made of metal such as aluminum. The insulating member 11 and the conductive member 22 share the axis Ax. The conductive member 22 covers the upper end of the insulating member 11 and comes into contact with the first shield member 24a inside the inner surface of the insulating member 11 and the second shield member 24b outside the outer surface of the insulating member 11. As a result, the conductive member 22 electrically interconnects the first shield member 24a and the second shield member 24b.

Thus, in the electromagnetic wave return circuit, the electromagnetic waves may be propagated through the first shield member 24a and the second shield member 24b to the matching device 32 via the conductive member 22. O-rings 13 are provided on the contact surface between the conductive member 22 and the insulating member 11 to seal the interiors of the plurality of gas through-holes 15 in the insulating member 11 from the atmospheric space and to maintain the pressure-reduced state in the gas through-holes 15.

The plasma processing apparatus 1 that supplies electromagnetic waves in the VHF band has an advantage of improving a film forming speed or the like by increasing the frequency of the electromagnetic waves for plasma excitation applied to the upper electrode 14. On the other hand, standing waves of surface waves are generated in the shower head 16 arranged under the upper electrode 14 that applies electromagnetic waves, and the standing waves may reduce the in-plane uniformity of plasma density. Further, the shape of the plasma processing apparatus 1 generates a higher-order mode of the propagation modes of electromagnetic waves, which causes a further decrease in plasma uniformity.

Increasing the frequency makes occurrence of electric discharge to become easier even under the condition in which the pressure of the processing container 10 is low, while making electric discharge to occur easily in the reduced-pressure space in the propagation region of the electromagnetic waves. That is, electric discharge is likely to occur within the insulating member 11 that supplies gas into the shower head 16.

Therefore, in the plasma processing apparatus 1 according to the first embodiment that supplies electromagnetic waves in the VHF band, the structure around the upper electrode 14 is concentrically ring-shaped and is rotationally symmetrical with respect to the axis Ax. This makes it possible to reduce non-uniformity of plasma density caused by the insulating member 11 having the gas through-holes 15 and to suppress electric discharge inside the gas through-holes 15.

As a result, in the plasma processing apparatus 1 that processes a substrate W with the plasma 2, it is possible to perform desired processing such as film formation, etching, and ashing of the substrate W with high accuracy.

Second Embodiment

[Plasma Processing Apparatus]

Figure 3:
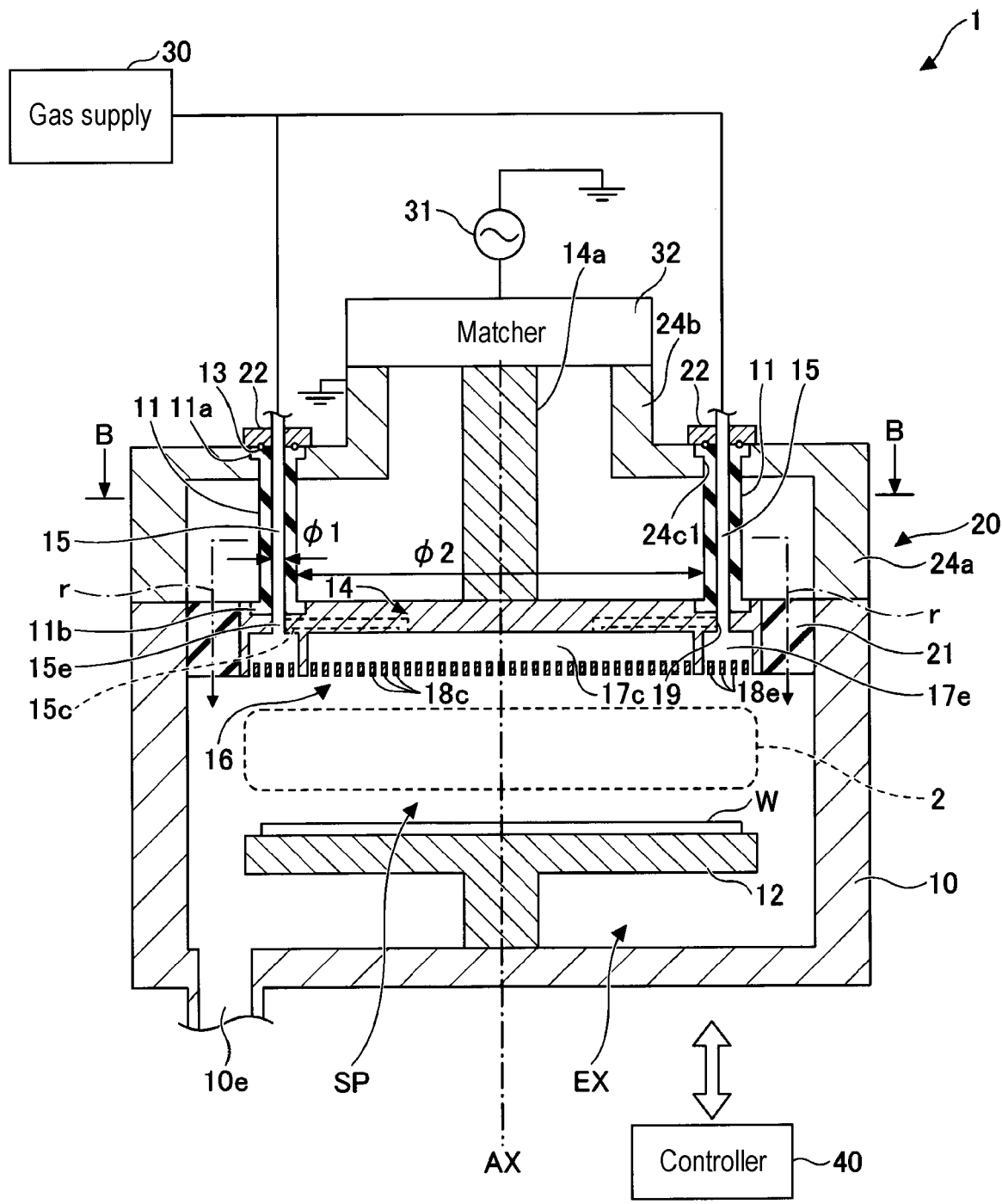
FIG. 3 is a cross-sectional schematic view illustrating an example of a plasma processing apparatus according to a second embodiment.
Figure 4:
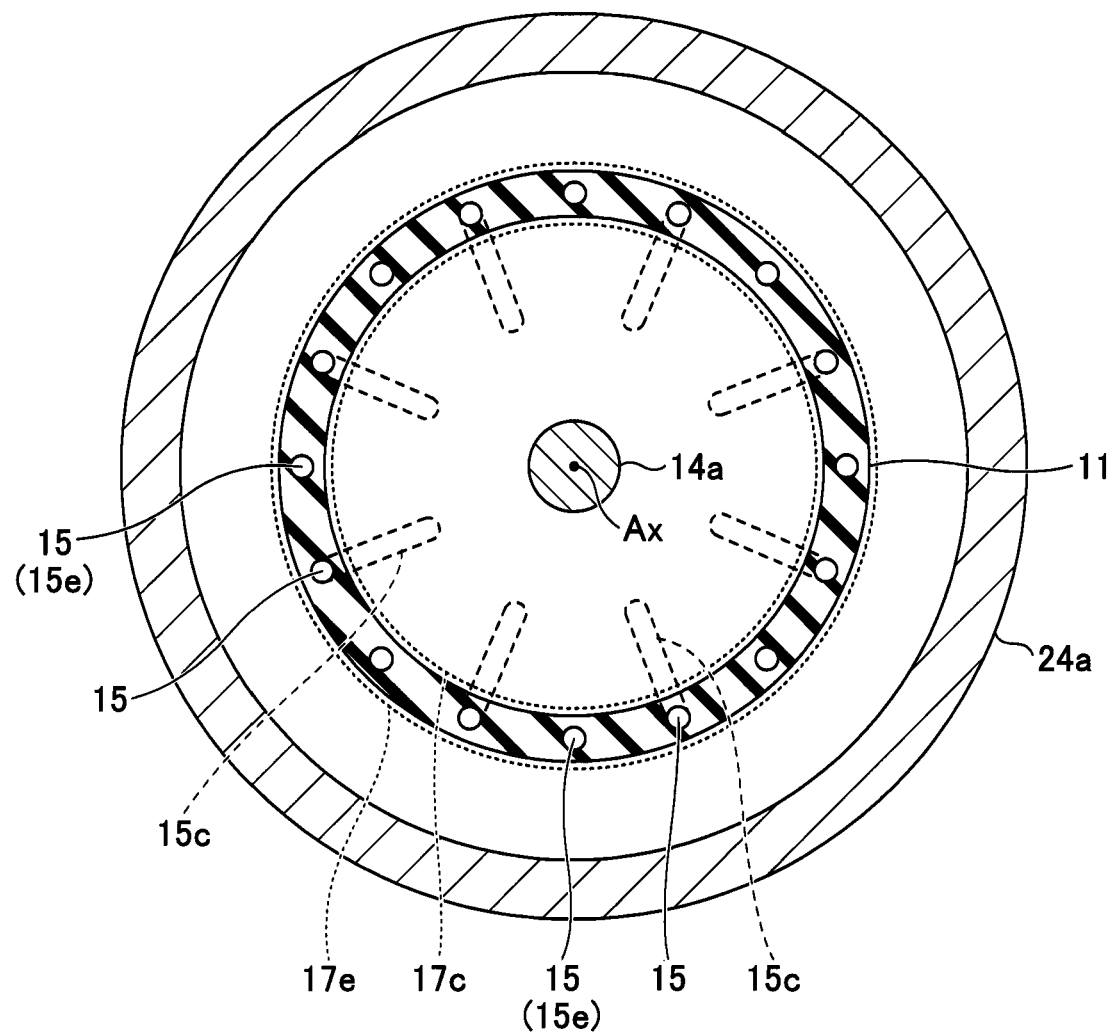
FIG. 4 is a view illustrating B-B cross section of FIG. 3.

Next, a plasma processing apparatus 1 according to a second embodiment will be described with reference to FIGS. 3 and 4. FIG. 3 is a schematic cross-sectional view illustrating an example of the plasma processing apparatus 1 according to the second embodiment. FIG. 4 is a view illustrating B-B cross section of FIG. 3.

The plasma processing apparatus 1 according to the second embodiment has the same basic configuration as the plasma processing apparatus 1 according to the first embodiment, except for the configurations of the insulating member 11 and the shower head 16. Therefore, the configurations of the insulating member 11 and the shower head 16, which are different from those of the plasma processing apparatus 1 according to the first embodiment, will be described below.

In the second embodiment, the upper end of the insulating member 11 is provided with a flange 11$a$, the lower end of the insulating member 11 is provided with a flange 11$b$, and the flanges 11$a$ and 11$b$ protrude outward from the insulating member 11. The flange 11$a$ is fitted into a stepped portion of a ring-shaped gap 24$c$1 formed between the first shield member 24$a$ and the second shield member 24$b$, and the flange 11$b$ is fitted into a stepped portion formed on the upper electrode 14. As a result, the insulating member 11 is fixed between the first shield member 24$a$ and the second shield member 24$b$ and the upper electrode 14. The flange 11$a$ is an example of the first end portion of the insulating member 11. The flange 11$b$ is an example of the second end portion of the insulating member 11 opposite to the first end portion.

In the second embodiment, the shower head 16 is partitioned into a first region 17$c$ on the inner peripheral side and a second region 17$e$ on the outer peripheral side. Some of the plurality of gas through-holes 15 communicate with the first region 17$c$, and the remaining ones of the plurality of gas through-holes 15 communicate with the second region 17$e$.

Referring to FIG. 4 illustrating B-B cross section of FIG. 3 together with FIG. 4, the gas through-holes 15 are alternately branched into gas paths 15$c$ that are branched horizontally and gas paths 15$e$ that extend vertically. That is, among the plurality of gas through-holes 15, eight gas through-holes 15 arranged alternately communicate with the gas paths 15$c$ communicating with the first region 17$c$ to supply gas to the first region 17$c$. The remaining eight gas through-holes 15 communicate with the gas paths 15$e$ communicating with the second region 17$e$ to supply gas to the second region 17$e$. The gas supplied to the first region 17$c$ is introduced into the space SP through the gas ejection holes 18$c$, and the gas supplied to the second region 17$e$ is introduced into the space SP through the gas ejection holes 18$e$.

With such a configuration, the flow rate control of the gas may be performed separately for the first region 17$c$ on the inner peripheral side and the second region 17$e$ formed on the outer periphery of the first region 17$c$. For example, when supplying an argon gas, the flow rate of the argon gas supplied to the first region 17$c$ and the flow rate of the argon gas supplied to the second region 17$e$ may be differently controlled.

The gas species supplied to the first region 17$c$ and the gas species supplied to the second region 17$e$ may be different. For example, the argon gas may be supplied to the first region 17$c$, and helium gas may be supplied to the second region 17$e$. Furthermore, zone control may be performed by dividing the gas species and flow rates into the first region 17$c$ and the second region 17$e$.

As described above, with the plasma processing apparatus 1 according to the second embodiment, it is also possible to reduce the non-uniformity of plasma density. In addition, it is possible to suppress electric discharge within the gas through-holes 15. That is, in the plasma processing apparatus 1 according to the second embodiment, the structure around the upper electrode 14 is concentrically ring-shaped and is rotationally symmetrical with respect to the axis Ax. As a result, it is possible to enhance the in-plane uniformity of plasma by arranging the insulating member 11 having the gas through holes 15 in the electromagnetic wave propagation space. In addition, it is possible to suppress electric discharge within the gas through-holes 15. Moreover, by performing zone control of the gas, it is possible to enhance the controllability of plasma density.

In the plasma processing apparatus 1, a semiconductor is manufactured on a substrate W by executing a step of providing the substrate W in the processing container 10 and a step of plasma-processing the substrate W in the processing container 10 to form the semiconductor device on the substrate W. With the plasma processing apparatus 1 according to the first and second embodiments, since it is possible to improve the in-plane uniformity of plasma as described above, it is possible to manufacture a good semiconductor device. The plasma processing apparatus 1 includes a controller 40 including a processor and a memory, and the processor controls each element of the plasma processing apparatus 1 to plasma-process a substrate W according to a recipe stored in the memory. As a result, a semiconductor device is formed by plasma processing such as film formation or etching.

The plasma processing apparatus and the semiconductor device manufacturing method according to each embodiment disclosed herein should be considered as examples in all respects, and not restrictive. Each embodiment may be modified and improved in various forms without departing from the scope and spirit of the appended claims. The matters described in the above embodiments may take other configurations within a range that is not contradictory and may be combined within the non-contradictory range.

For example, a target member, which is a structure around the upper electrode 14, is concentrically ring-shaped, and is rotationally symmetric with respect to the axis Ax, is not limited to the insulating member 11 for supplying gas. For example, even in the case where a member through which a flow path for a fluid such as a coolant passes is disposed in a space through which electromagnetic waves pass, it is possible to improve the in-plane uniformity of plasma by arranging the member to be concentrically ring-shaped and to be rotationally symmetrical with respect to the axis line Ax. In addition, even when a wire for signal transmission such as an optical fiber passes through a space through which electromagnetic waves pass, it is possible to improve in-plane uniformity of plasma by arranging a member in which the wire is bundled to be concentrically ring-shaped and to be rotationally symmetrical with respect to the axis Ax.

This application claims the priority of basic application No. 2020-154861 filed with the Japanese Patent Office on Sep. 15, 2020, the disclosure of which is incorporated herein in its entirety by reference.

EXPLANATION OF REFERENCE NUMERALS

1: plasma processing apparatus, 10: processing container, 11: insulating member, 12: stage, 14: upper electrode, 14a: power supply member, 16: shower head, 20: coaxial waveguide, 22: conductive member, 24a: first shield member, 24b: second shield member, 30: gas supply, 31: power supply, 40: controller, 201: coaxial line, W: substrate

What is claimed is:

1. A plasma processing apparatus which generates plasma by electromagnetic waves supplied into a processing container to perform processing of a substrate, the plasma processing apparatus comprising:
    an upper electrode disposed in an upper portion of the processing container;
    a power supply member which is connected to the upper electrode to supply the electromagnetic waves to the upper electrode;
    a first shield member configured to electrically shield the upper electrode and the power supply member;
    a second shield member configured to electrically shield the upper electrode and the power supply member;
    a ring-shaped insulating member provided between the upper electrode and the first shield member and between the upper electrode and the second shield member, and having a plurality of gas through-holes penetrating an inside of the ring-shaped insulating member; and
    a conductive member covering a first end portion of the insulating member and electrically interconnecting the first shield member to the second shield member,
    wherein the power supply member passes through an inner space in the insulating member and supplies the electromagnetic waves to the upper electrode.

2. The plasma processing apparatus of claim 1, wherein the first end portion of the insulating member is in direct contact with both the first shield member and the second shield member, and a second end of the insulating member is in direct contact with the upper electrode.

3. The plasma processing apparatus of claim 2, wherein the electromagnetic waves are electromagnetic waves in a VHF band or UHF band.

4. The plasma processing apparatus of claim 3, wherein the electromagnetic waves have a frequency of 100 MHz or higher and 800 MHz or lower.

5. The plasma processing apparatus of claim 4, wherein the power supply member and the insulating member are configured to share a central axis.

6. The plasma processing apparatus of claim 5, wherein the plurality of gas through-holes are provided rotationally symmetrically with respect to the central axis.

7. The plasma-processing apparatus of claim 6, further comprising:
    a shower head including a gas path communicating with the plurality of gas through-holes under the upper electrode.

8. The plasma processing apparatus of claim 7, wherein the shower head is partitioned into a first region and a second region formed around an outer periphery of the first region,
    wherein some of the plurality of gas through-holes communicate with the first region, and
    wherein remaining ones of the plurality of gas through-holes communicate with the second region.

9. The plasma processing apparatus of claim 8, wherein the plurality of gas through-holes has a diameter of 6 mm or less.

10. The plasma processing apparatus of claim 9, wherein the insulating member has an inner diameter of 150 mm or more.

11. A method of manufacturing a semiconductor device by using the plasma processing apparatus set forth in claim 1, the method comprising:
    providing a substrate within the processing container of the plasma processing apparatus; and
    plasma-processing the substrate within the processing container to form the semiconductor device on the substrate thereby.

12. The plasma processing apparatus of claim 1, wherein the electromagnetic waves are electromagnetic waves in a VHF band or UHF band.

13. The plasma processing apparatus of claim 1, wherein the power supply member and the insulating member are configured to share a central axis.

14. The plasma-processing apparatus of claim 1, further comprising:
    a shower head including a gas path communicating with the plurality of gas through-holes under the upper electrode.

15. The plasma processing apparatus of claim 1, wherein the plurality of gas through-holes has a diameter of 6 mm or less.

16. The plasma processing apparatus of claim 1, wherein the insulating member has an inner diameter of 150 mm or more.

* * * * *